(12) United States Patent
Heise

(10) Patent No.: US 9,598,061 B2
(45) Date of Patent: Mar. 21, 2017

(54) ELECTROHYDRAULIC OR ELECTROMECHANICAL MOTOR VEHICLE CONTROL DEVICE

(71) Applicant: Continental Teves AG & Co. oHG, Frankfurt (DE)

(72) Inventor: Andreas Heise, Erzhausen (DE)

(73) Assignee: CONTINENTAL TEVES AG & CO. OHG, Frankfurt (DE)

( * ) Notice: Subject to any disclaimer, the term of this patent is extended or adjusted under 35 U.S.C. 154(b) by 0 days.

(21) Appl. No.: 14/441,314

(22) PCT Filed: Oct. 29, 2013

(86) PCT No.: PCT/EP2013/072621
§ 371 (c)(1),
(2) Date: May 7, 2015

(87) PCT Pub. No.: WO2014/072207
PCT Pub. Date: May 15, 2014

(65) Prior Publication Data
US 2015/0274138 A1     Oct. 1, 2015

(30) Foreign Application Priority Data
Nov. 9, 2012    (DE) ......................... 10 2012 220 485

(51) Int. Cl.
*B60T 8/36* (2006.01)
*B60T 8/17* (2006.01)
(Continued)

(52) U.S. Cl.
CPC ........ *B60T 8/17* (2013.01); *B60T 7/12* (2013.01); *B60T 8/368* (2013.01); *H01R 4/308* (2013.01);
(Continued)

(58) Field of Classification Search
CPC ........... H01R 4/64; H01R 4/648; H01R 4/652
(Continued)

(56) References Cited

U.S. PATENT DOCUMENTS

| 6,241,489 B1 | 6/2001 | Lewin et al. |
| 2005/0018390 A1* | 1/2005 | Sanada ................. H05K 3/308 |
| | | 361/752 |

(Continued)

FOREIGN PATENT DOCUMENTS

| CN | 101062677 A | 10/2007 |
| DE | 10 2012 216 051 | 12/2013 |

(Continued)

OTHER PUBLICATIONS

PCT International Search Report—May 15, 2014.

*Primary Examiner* — Hien Vu
(74) *Attorney, Agent, or Firm* — Brinks Gilson & Lione

(57) ABSTRACT

The invention relates to an electrohydraulic and/or electromechanical motor vehicle control device (I), in particular for a motor vehicle brake system, including an electronic control unit (4), which is connected to a hydraulic unit (3) or at least to one electrically conductive housing part. The electronic control unit includes at least one first circuit board (5) for accommodating electrical or electronic components and includes at least one connecting plug (8), which electronic control unit is further characterized in that at least one electrically conductive connecting contact (6) is provided, which is connected to at least one electrically conductive fastening means (8) in such a way that there is an electrically conductive connection between the electrically conductive main body of the hydraulic unit (3) and/or the housing part and the reference potential of the circuit board (5) of the electronic control unit (4).

11 Claims, 4 Drawing Sheets

(51) Int. Cl.
*H01R 4/30* (2006.01)
*H01R 13/207* (2006.01)
*B60T 7/12* (2006.01)
*H05K 5/00* (2006.01)

(52) U.S. Cl.
CPC ......... *H01R 13/207* (2013.01); *H05K 5/0008* (2013.01); *H05K 5/0047* (2013.01)

(58) Field of Classification Search
USPC .......................... 303/119.2, 0.3; 439/92, 97
See application file for complete search history.

(56) References Cited

U.S. PATENT DOCUMENTS

2007/0252431 A1* 11/2007 Tsunooka ................ B60T 8/368
 303/119.3
2008/0017174 A1* 1/2008 Kafer .................... B60T 8/3675
 123/479
2015/0028665 A1* 1/2015 Heise ........................ B60T 8/17
 303/10

FOREIGN PATENT DOCUMENTS

DE     10 2012 219 5     4/2014
WO   WO 2006/067070 A1   6/2006

* cited by examiner

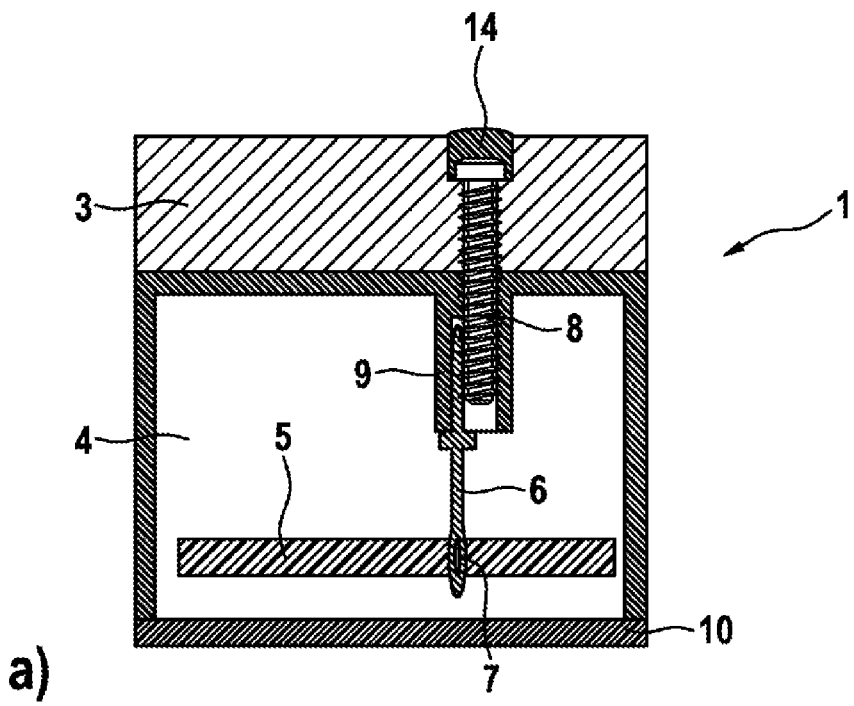
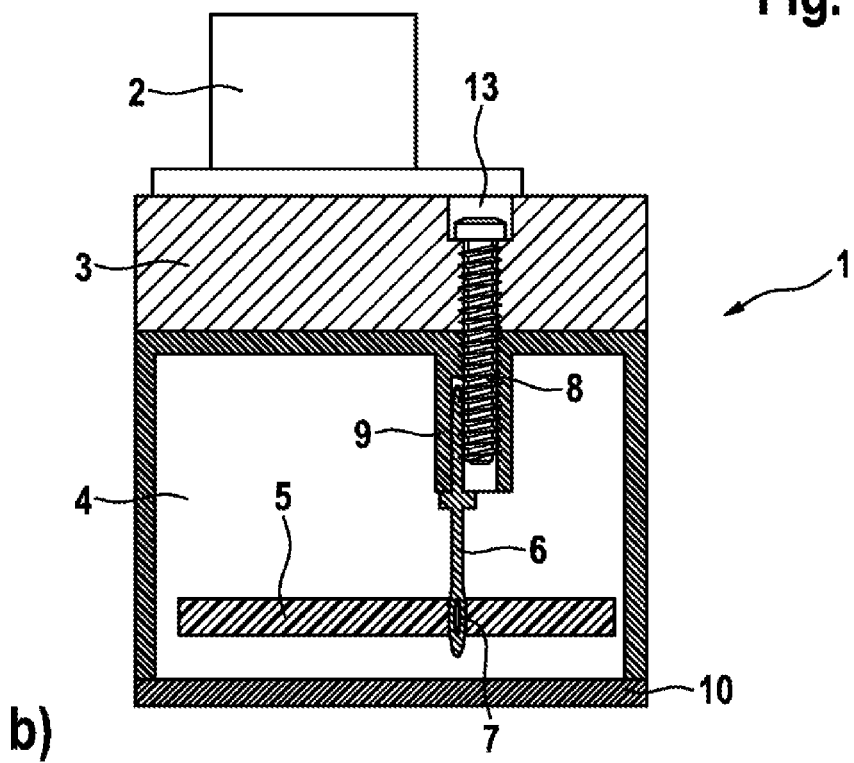
Fig. 2

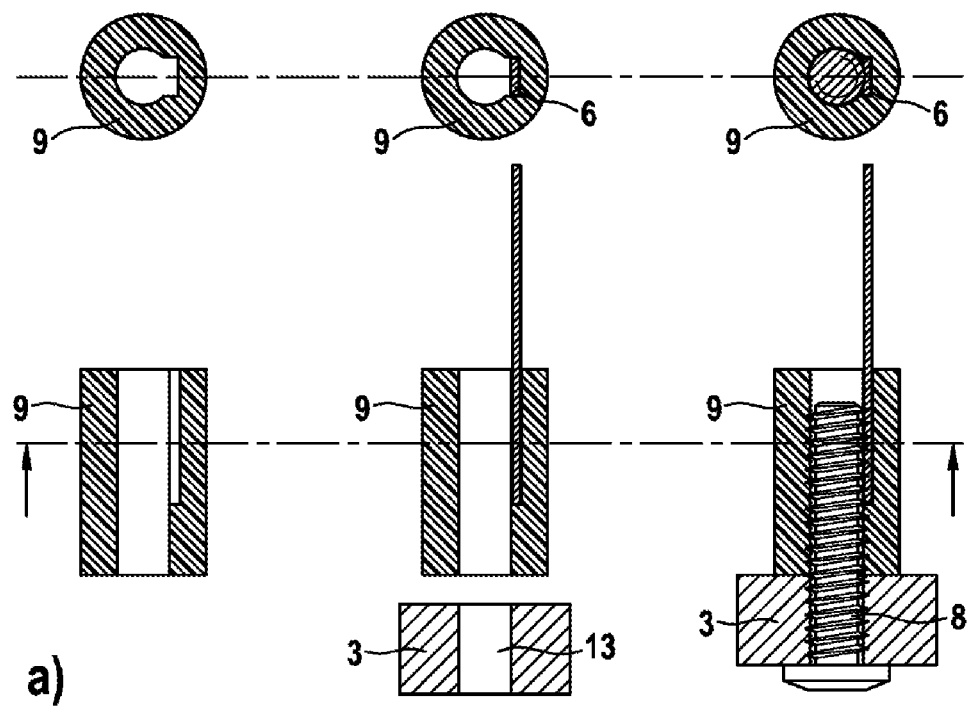
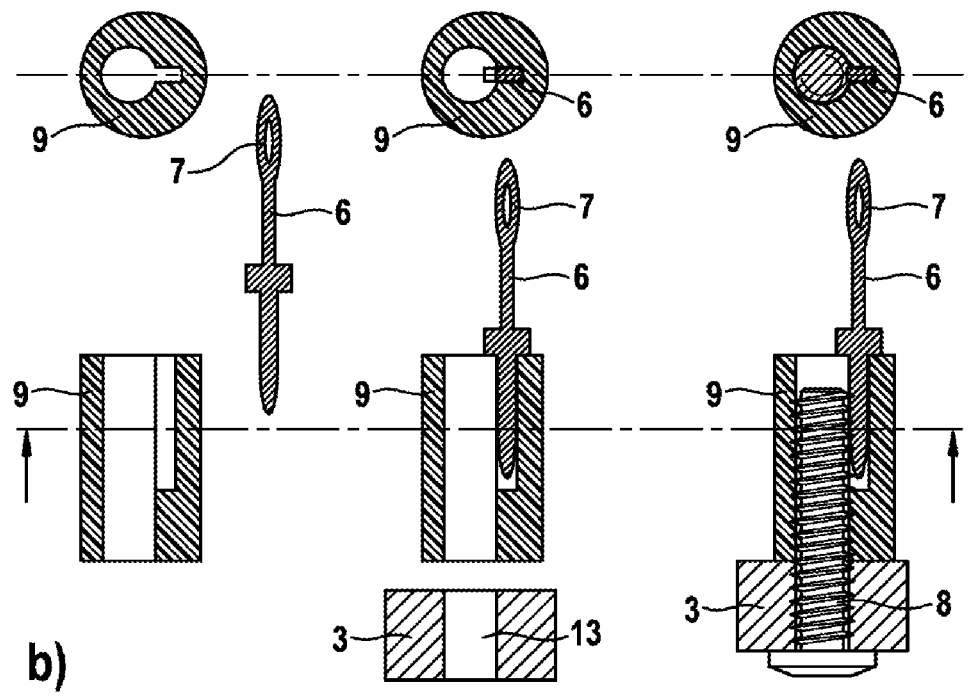
Fig. 4

ELECTROHYDRAULIC OR ELECTROMECHANICAL MOTOR VEHICLE CONTROL DEVICE

CROSS REFERENCE TO RELATED APPLICATIONS

This application claims priority to German Patent Application No. 10 2012 220 485.7, filed on Nov. 9, 2012 and PCT/EP2013/072621, filed Oct. 29, 2013.

FIELD OF THE INVENTION

The present invention relates to an electrohydraulic and/or an electromechanical motor vehicle control device.

BACKGROUND

Electrohydraulic motor vehicle control devices, such as pressure control apparatuses (hydraulic and electronic control unit, HECU) for brake systems, commonly exhibit an arrangement which comprises an electronic control unit on one side, a hydraulic unit in the middle, and an electric motor unit for a hydraulic pump on the opposite side of the pressure control apparatus. The control unit makes contact with the electric motor unit with the aid of a pump motor adapter which is known per se. Electromechanical control units, such as transmission control units for example, and also electrohydraulic control units often have a conductive, in particular metallic, housing part and an integral or multipartite housing part which is composed of plastic. The two housing parts often also jointly form the outer boundary of the control devices at the same time.

During operation, electrical potential differences between the main body of the hydraulic unit, which main body is composed of an electrically conductive solid material, and/or the electrically conductive housing part and the electronic control unit can lead to faults, damage or destruction of sensitive electronic components and therefore have an adverse effect on the availability of the respective system which is to be controlled, and on the safety of personnel. Therefore, stringent requirements are placed particularly on electromagnetic compatibility and in respect of protection against electrostatic discharging. Establishing an electrical connection between different conductive components in order to establish potential compensation is known per se.

The focus for electrical contact-making means in motor vehicle control devices is, in addition to a robust design, also a small structural and functional central insert. In this case, robustness is to be understood as meaning, for example, vibration resistance, corrosion resistance, temperature resistance and resistance to aging.

Sealing-off at the inlet point into the housing is problematical for an insulated ground strap which is routed from the vehicle body, as reference potential, by means of a sealed contact plug, into the housing of the electronic control unit since water can enter the housing through the sealed-off contact plug owing to the capillary effect of the insulated braided ground strap and can destroy the contact plug and also other components.

Prior application DE 102 012 219 579, describes a connection of a reference potential of a vehicle by means of a hydraulic unit, wherein a connecting contact is provided between the hydraulic unit and a printed circuit board, this creating a main current connection of the reference potential of an electronic control unit.

Prior application EP 12 464 013, describes an electrohydraulic pressure control apparatus for motor vehicle brake systems, which electrohydraulic pressure control apparatus has an electrically conductive connecting contact between a hydraulic unit and an electronic control unit, which electrically conductive connecting contact comprises an elastic or spring-action means along the longitudinal axis. There is enormous cost pressure on all of the components on account of the high numbers in which motor vehicle control devices are produced. In this case, factors which drive price include, in particular, saving on material and also on process steps during production. It is also necessary to further reduce the space requirement and the weight of existing systems and nevertheless to at least maintain or to improve availability in the process.

The object of the invention is to provide an electrohydraulic or an electromechanical motor vehicle control device which better meet/meets the requirements of modern and future control devices.

This object is achieved by an electrohydraulic and/or electromechanical motor vehicle control device as described herein.

SUMMARY AND INTRODUCTORY DESCRIPTION OF THE INVENTION

The present invention describes an electrohydraulic or electromechanical motor vehicle control device, in particular for a motor vehicle brake system, including an electronic control unit which is connected to a hydraulic unit and/or at least to an electrically conductive housing part, wherein said electronic control unit includes at least one first printed circuit board for holding electrical or electronic components and also includes at least one connection plug, and is further distinguished in that at least one electrically conductive connecting contact is provided, said connecting contact being connected to at least one electrically conductive fastening means in such a way that an electrically conductive connection is established between the electrically conductive main body of the hydraulic unit and/or the housing part and the reference potential of the printed circuit board of the electronic control unit.

The fastening means is preferably provided in a recess in the main body of the hydraulic unit or in the housing part, wherein the fastening means is electrically conductively connected to the main body of the hydraulic unit and/or to the housing part.

According to one preferred embodiment, the fastening means is provided in the form of a screw fastener received in a bore of a shaped portion of the hydraulic unit, the bore forming a notch at least in the connecting contact in order to form an electrical connection.

It is further preferred for the notching means of the fastening means to form a notch in at least one shaped portion forming a bore to receive the screw fastener, in particular of the housing of the electronic control unit, in order to provide mechanical fixing.

The fastening means is preferably in the form of a self-tapping and/or metric screw comprising a screw head, wherein the screw head rests on a projection, in particular in the recess in the main body of the hydraulic unit and/or in the housing part, on a side which is averted from the electronic control unit.

The connecting contact is preferably electrically conductively connected to the printed circuit board by means of at least one press-in contact.

According to a further preferred embodiment, a reference electrical potential (ground) connection for forming a high-current connection to the main body of the hydraulic unit and/or to the housing part is provided, said reference potential connection connecting a reference potential of the motor vehicle to the main body of the hydraulic unit and/or to the housing part. Examples of a reference potential connection include a ground strap or else a metallic holder on the hydraulic unit and/or on the housing part, which metallic holder electrically conductively connects the hydraulic unit and/or the housing part to further vehicle components, in particular to the vehicle reference potential.

The fastening means preferably mechanically fixes at least one further component, in particular at least one housing element of the electric motor unit, to the main body of the hydraulic unit and/or to the housing part.

BRIEF DESCRIPTION OF THE DRAWINGS

Further preferred embodiments can be found in the following description of exemplary embodiments with reference to the figures, in which:

FIG. 2 shows further exemplary embodiments of ways of sealing off the screw recess of an electrohydraulic pressure control apparatus, FIG. 4 shows illustrations for providing a mechanical and electrical connection, which is produced by a screw, during assembly, and also different installation positions for a contact element.

FURTHER DESCRIPTION OF THE INVENTION

Figure 1:
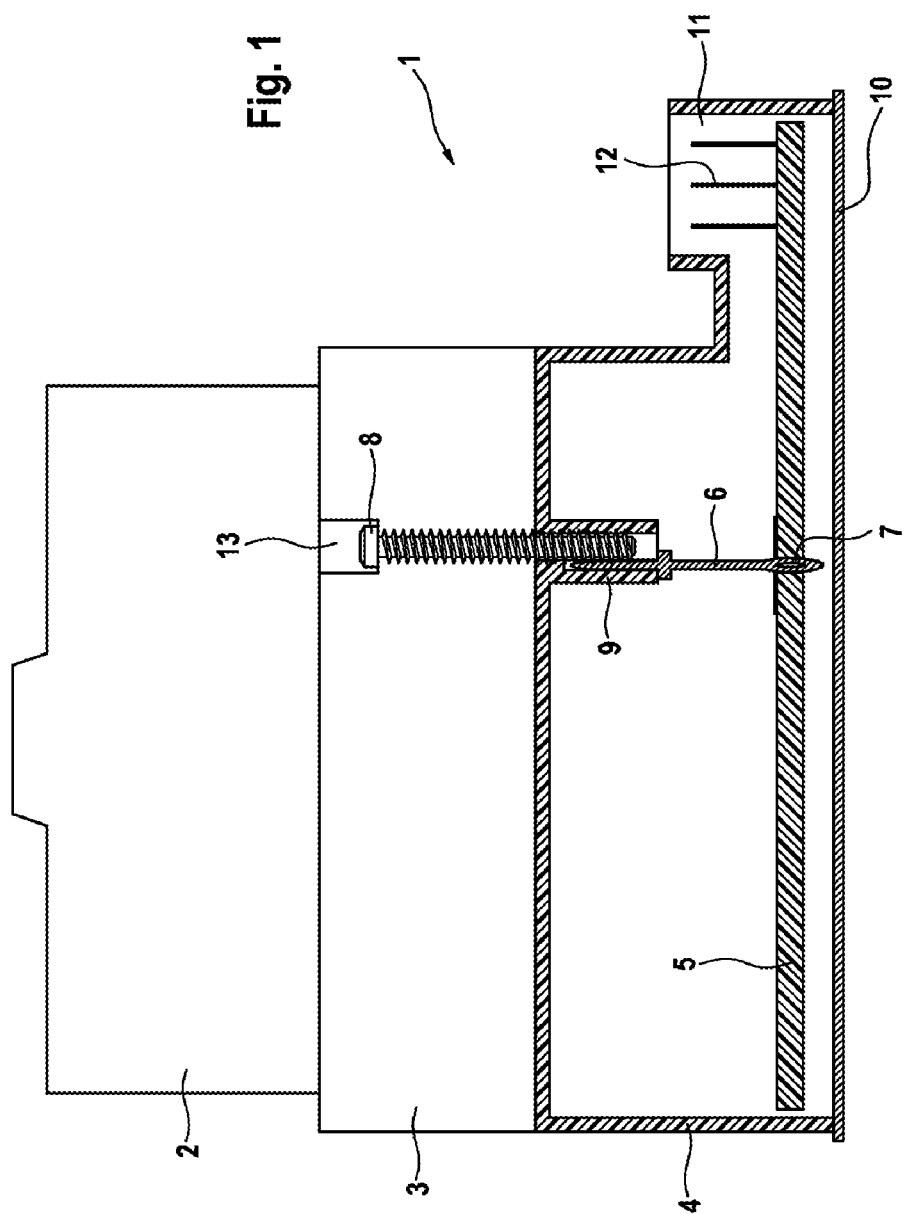
FIG. 1 shows a first embodiment of the electrohydraulic and/or electromechanical motor vehicle control device according to the invention using the example of an electrohydraulic pressure control apparatus for motor vehicle brake systems.

FIG. 1 schematically illustrates, by way of example for a first embodiment of the electrohydraulic and/or electromechanical motor vehicle control device according to the invention, a commercially available electrohydraulic pressure control apparatus 1 (HECU) for a motor vehicle brake system having the additional features according to the invention. Only those components which are necessary for understanding the present invention are illustrated. The HECU 1 includes three units, the electric motor unit 2 which is the drive of the hydraulic pump, the hydraulic unit 3 (HCU) in which, in particular, the valves for controlling the motor vehicle brake system and the pump mechanism are accommodated, and the electronic control unit 4 (ECU) by which the valves are driven.

Control unit 4 contains printed circuit board 5 on which the electronic components which are required for driving purposes are arranged. The coils which switch the valves are likewise located in the housing of the electronic control unit 4, but are not depicted. According to this exemplary embodiment, covering plate 10 forms a separate component of the housing of control unit 4, wherein this housing part is composed of an electrically conductive material, in particular a metal, according to this exemplary embodiment.

Figure 3:
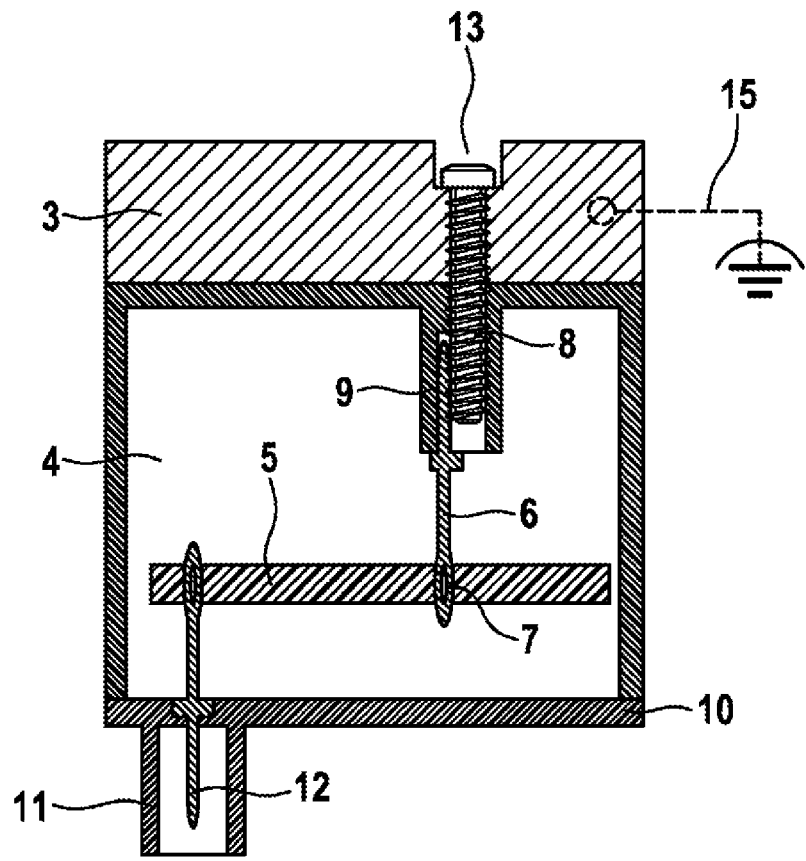
FIG. 3 shows an exemplary embodiment with connection of a main body of the hydraulic unit to a reference potential of a vehicle with sealing off being provided by a screw head resting in a sealing manner on an electrically conductive main body of a hydraulic unit.

Connecting contact 6, in combination with the screw fastener 8 which is inserted into a recess 13, which is provided for this purpose, in the hydraulic unit 3, establishes, from the sides of the electric motor unit 2, an electrically low-impedance conducting connection between the electrically conductive main body of hydraulic unit 3 and the reference potential of printed circuit board 5. This results in a common ground or reference potential or it being possible for the two ground potentials to be connected to suitable electronic components, such as capacitors or resistors for example, as a result of which electromagnetic compatibility is increased and protection against electrostatic discharging is improved. If there is an electrical connection 15 between the main body of the hydraulic unit and the reference potential of the vehicle, as is illustrated in FIG. 3, power can be supplied to the HECU 1 with the aid of the connection 15 and by means of connecting contact 6 and screw fastener 8 as well as press-in contact connection 7 to the printed circuit board 5. According to the exemplary embodiment in FIG. 1 and FIG. 2b), recess 13 is covered and sealed off from the motor compartment by the electric motor unit 2 and the sealing flange of said electric motor unit, wherein the sealing flange as such is not illustrated. As an alternative, screw fastener 8 can mechanically fix at least one further component of electrohydraulic pressure control apparatus 1, but in particular a housing element of electric motor unit 2 which substantially encloses the actual electric motor in the assembled state, to hydraulic unit 3. FIG. 2a) provides sealing off by means of separate sealing means, in particular composed of silicone. In FIG. 3, sealing is implemented by the screw fastener head by virtue of the screw head pressing against a contact-pressure region, in particular a projection in screw recess 13 in the main body of the hydraulic unit 3, this placing more stringent requirements on the screw prestress. If, as an alternative, as may be the case for electromechanical control devices, or in addition to the electrical connection of the main body of the hydraulic unit 3 to printed circuit board 5, a screw for electrically connecting an electrically conductive housing part, such as covering plate 10 for example, to printed circuit board 5 is provided, the screw head can preferably rest on the housing part.

Connecting contact 6 has at least one press-in contact 7, as is used in electronic circuit technology in a manner which is known per se, for connection to printed circuit board 5. As an alternative, connecting contact 6 can also be connected to printed circuit board 5 by soldering for example. If electrical low- and/or high-current contact pins 12 are used for the contact plug 11 in HECU 1, as is illustrated using an example contact pin in FIG. 3, a contact pin which is substantially the same can be used as connecting contact 6.

As illustrated in FIGS. 4a) and b), the bore of shaped portion 9 of the housing of control unit 4 forms a notch, which housing is composed of plastic in particular, and also in the material of the connecting contact 6 during assembly. Mechanical fixing and contact-connection can therefore take place in a single process step. Notches can likewise be formed in the material of the main body of hydraulic unit 3, in particular in order to improve the contact-connection or mechanical stability. As an alternative, prefabricated threaded bore can be provided in the main body of the hydraulic unit 3 and/or in the bore of shaped portion 9. During assembly of pressure control apparatus 1, connecting contact 6 can project into, be inserted into, pressed into or moulded into shaped portion 9, before screw 8 is screwed in. In one embodiment connecting contact 6 forms a shoulder which controls its depth of insertion into the notch of the shaped portion 9 bore. Connecting contact 6 is then mechanically fixed and electrically contact-connected to the main body of the hydraulic unit 3 by screw 8 at the latest after screw 8 is screwed in. In addition, a plurality of parallel arrangements of the connection according to the invention of printed circuit board 5 to the main body of the hydraulic unit 3 can be provided.

Suitable types of screw 8 include, in particular, commercially available self-tapping screws or screws with metric thread, which screws are produced from metal in particular. The head of screw 8 can provide a sealing function, for example by an interlocking connection, or separate sealing means are provided. Connecting contact 6, like press-in contact 7, is composed of commercially available materials, such as CuSN4, CuSN5, CuSN6 or CuNiSi for example, or substantially contains said materials. As an alternative to screw 8, threaded rods without a head can also be used. If, however, screws are used without contact pressure of the screw head, these screws not tapping into the metallic region of the main body of the hydraulic unit 3, mechanical fixing, as protection against loosening on account of vibrations, is provided in order to stabilize the arrangement on the plastic housing, this being reinforced by the inserted connecting contact 6. In addition, screw-securing and/or sealing means 14 can further be provided, said means being matched to the ambient conditions and preventing screw 8 from coming loose or preventing the ingress of moisture.

Connecting contact 6 or press-in contact 7 can preferably be surface-coated, for example, by zinc plating or with tin, and/or screw 8 can preferably be surface-coated, for example, by zinc flake coating or else copper plating or combinations thereof.

While the above description constitutes the preferred embodiment of the present invention, it will be appreciated that the invention is susceptible to modification, variation and change without departing from the proper scope and fair meaning of the accompanying claims.

The invention claimed is:

1. An electrohydraulic or electromechanical motor vehicle control device for a motor vehicle brake system, comprising an electronic control unit which is connected to a hydraulic unit or to an electrically conductive housing part, wherein the electronic control unit includes at least one first printed circuit board for holding electrical or electronic components and further having at least one contact pin, and at least one electrically conductive connecting contact which contacts the first printed circuit board, the connecting contact contacting a screw fastener extending from the hydraulic unit or the housing part such that an electrically conductive connection is established between the hydraulic unit or the electrically conductive housing part and the a reference potential of the printed circuit board of the electronic control unit, the electronic control unit having a shaped portion forming a bore receiving the screw fastener, the bore having a notch for receiving at least a portion of the connecting contact in order to form the conductive connection.

2. The electrohydraulic or electromechanical motor vehicle control device as claimed in claim 1, further comprising in that the screw fastener is provided in a recess in a main body of the hydraulic unit or in the housing part, wherein the screw fastener is electrically conductively connected to the main body of the hydraulic unit or to the housing part.

3. The electrohydraulic or electromechanical motor vehicle control device as claimed in claim 1 further comprising in that the bore of the electronic control unit cooperates with the screw fastener in order to provide mechanical fixing.

4. The electrohydraulic or electromechanical motor vehicle control device as claimed in claim 2 further comprising in that the screw fastener is in the form of a self-tapping or a metric screw having a screw head, wherein the screw head rests on a projection in the recess in the main body of the hydraulic unit or in the housing part, on a side which is opposite from the electronic control unit.

5. The electrohydraulic or electromechanical motor vehicle control device as claimed in claim 1 further comprising in that the connecting contact is electrically conductively connected to the printed circuit board by at least one press-in contact.

6. The electrohydraulic or electromechanical motor vehicle control device as claimed in claim 1 further comprising in that a reference electrical potential connection for forming a high-current connection to a main body of the hydraulic unit or to the housing part, the reference electrical potential connection connecting a reference electrical potential of the motor vehicle to the main body of the hydraulic unit or to the housing part.

7. The electrohydraulic or electromechanical motor vehicle control device as claimed in claim 1 further comprising in that the screw fastener mechanically fixes a housing of an electrical motor unit to a main body of the hydraulic unit or to the housing part.

8. The electrohydraulic or electromechanical motor vehicle control device as claimed in claim 1 further comprising wherein the recess lies adjacent to the bore and is positioned such that the connecting contact extends along a line parallel to and displaced from the axis of the bore.

9. The electrohydraulic or electromechanical motor vehicle control device as claimed in claim 1 further comprising wherein the notch retains the connecting contact before the screw fastener is inserted into the bore.

10. The electrohydraulic or electromechanical motor vehicle control device as claimed in claim 1 further comprising the connecting contact forming a shoulder which controls the depth of insertion of the connecting contact within the notch of the bore.

11. The electrohydraulic or electromechanical motor vehicle control device as claimed in claim 1 further comprising the electrical connection between the fastening screw and the connecting contact occurring at one or more contacts of threads of the fastening screw in contact with the connecting contact.

* * * * *